(12) United States Patent
Ebuchi

(10) Patent No.: US 7,825,707 B2
(45) Date of Patent: Nov. 2, 2010

(54) CLOCK GENERATION CIRCUIT HAVING A SPREAD SPECTRUM CLOCKING FUNCTION

(75) Inventor: Tsuyoshi Ebuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 112 days.

(21) Appl. No.: 12/095,094

(22) PCT Filed: Nov. 30, 2006

(86) PCT No.: PCT/JP2006/324006
§ 371 (c)(1),
(2), (4) Date: May 27, 2008

(87) PCT Pub. No.: WO2007/080719
PCT Pub. Date: Jul. 19, 2007

(65) Prior Publication Data
US 2009/0284297 A1    Nov. 19, 2009

(30) Foreign Application Priority Data
Jan. 11, 2006    (JP) .............................. 2006-003513

(51) Int. Cl.
*H03L 7/06*    (2006.01)
(52) U.S. Cl. .................. 327/156; 327/147; 327/245; 375/308
(58) Field of Classification Search .................. 375/308; 327/245, 147, 156
See application file for complete search history.

(56) References Cited
U.S. PATENT DOCUMENTS
2005/0135505 A1*    6/2005    Ebuchi et al. ............... 375/308

| | | |
|---|---|---|
| 2005/1013550 | 6/2005 | Ebuchi et al. |
| 2006/0076997 A1 | 4/2006 | Ogasawara |

FOREIGN PATENT DOCUMENTS

| | | |
|---|---|---|
| JP | 2000-091911 | 3/2000 |
| JP | 2001-202153 | 7/2001 |
| JP | 2004-152361 | 5/2004 |
| JP | 2005-072939 | 3/2005 |
| JP | 2005-184488 | 7/2005 |

OTHER PUBLICATIONS

"Serial ATA: High Speed Serialized AT Attachment" Revision 1.0, Aug. 29, 2001, Serial ATA.
Japanese Notice of Reasons for Rejection, with English Translation, issued in Japanese Patent Application No. 2007-553847, mailed Jan. 5, 2010.

* cited by examiner

*Primary Examiner*—Lincoln Donovan
*Assistant Examiner*—John W Poos
(74) *Attorney, Agent, or Firm*—McDermott Will & Emery LLP

(57) ABSTRACT

A multiphase clock generation circuit (111) for generating a multiphase clock signal, a phase subdivision unit (113) for shifting a phase of the multiphase clock signal output from the multiphase clock generation circuit (111), and a clock selection unit (114) for selecting one of clock signals output from the phase subdivision unit (113) are provided. A PLL circuit (120) for receiving an output from a frequency division circuit (115) is further provided. The phase shift carried out by the phase subdivision unit (113) and the selection of the clock signal carried out by the clock selection unit (114) are controlled by a frequency control unit (112) to switch SSC ON/OFF and to change the bandwidth of the PLL circuit (120).

9 Claims, 13 Drawing Sheets

| | PICTRL3 | PICTRL2 | PICTRL1 | NPICTRL3 | NPICTRL2 | NPICTRL1 | Phase Shift(ps) |
|---|---|---|---|---|---|---|---|
| Code1 | 0 | 0 | 0 | 1 | 1 | 1 | 0 |
| Code2 | 0 | 0 | 1 | 1 | 1 | 0 | 25 |
| Code3 | 0 | 1 | 0 | 1 | 0 | 1 | 50 |
| Code4 | 0 | 1 | 1 | 0 | 0 | 0 | 75 |
| Code5 | 1 | 0 | 0 | 0 | 1 | 1 | 100 |
| Code6 | 1 | 0 | 1 | 0 | 1 | 0 | 125 |
| Code7 | 1 | 1 | 0 | 0 | 0 | 1 | 150 |
| Code8 | 1 | 1 | 1 | 0 | 0 | 0 | 175 |

|  | bandwidth (MHz) | Rlpf(kΩ) | C1lpf(pF) | C2lpf(pF) | CP current (uA) | VCO gain (GHz/V) |
|---|---|---|---|---|---|---|
| SSC_EN=H | 4.38 | 7 | 27 | 3.4 | 10 | 2.5 |
| SSC_EN=L | 11.4 | 5 | 8 | 1 | 40 | 2.5 | in the case where SSC_EN=H in the case where SSC_EN=L

| LOCKDET | SSC_EN | SSC ON/OFF |
|---------|--------|------------|
| L | L | OFF |
| L | H | OFF |
| H | L | OFF |
| H | H | ON |

(i) $0 < t < 0.5/fm$  $f = (1-\delta)fnom + 2fm \cdot \delta \cdot fnom \cdot t$
(ii) $0.5/fm < t < 1/fm$  $f = (1+\delta)fnom - 2fm \cdot \delta \cdot fnom \cdot t$

CLOCK GENERATION CIRCUIT HAVING A SPREAD SPECTRUM CLOCKING FUNCTION

RELATED APPLICATIONS

This application is the U.S. National Phase under 35 U.S.C. §371 of International Application No. PCT/JP2006/324006, filed on Nov. 30, 2006, which in turn claims the benefit of Japanese Application No. 2006-003513, filed on Jan. 11, 2006, the disclosures of which Applications are incorporated by reference herein.

TECHNICAL FIELD

The present invention relates to a clock generation circuit having a spread spectrum clocking function.

BACKGROUND ART

In an interface standard such as Serial ATA, spread spectrum clocking (which is hereinafter abbreviated to SSC) is defined to reduce EMI (electro magnetic interface) (see, for example, Document 1).

FIG. 17 is a graph showing how a clock frequency varies according to a SSC function in the Serial ATA standard. Moreover, FIG. 18 is an example of a spectrum of a clock signal according to the SSC function in the Serial ATA standard. SSC is a technique of modulating the frequency of a clock signal output from a clock source so as to have a predetermined percentage modulation (for example, δ=0.5%) and a predetermined modulation period (for example, fm=30 kHz to 33 kHz) for spreading the spectrum as shown in FIG. 17, to thereby reduce the peak value of the spectrum as shown in FIG. 18.

An example of a clock generation circuit for realizing a spread spectrum is a circuit including: a PLL circuit for generating clock signals having a plurality of kinds of phases; and a phase interpolation unit for performing a periodic phase shift on the generated clock signals having the plurality of kinds of phases, wherein one clock signal which is to be output is selected from a plurality of kinds of clock signals generated by the phase interpolation unit (for example, see Patent Document 1).

In the clock generation circuit which in this way generates a spread spectrum clock signal, the periodic phase shift is performed out of the PLL circuit. Therefore, if phase variations in the phase shift exist, the variations may directly appear as high frequency jitter in an output. If a data signal including the high frequency jitter is output, a receiving circuit may not be able to receive the data, and thus the connectivity between sets having a Serial ATA may be reduced.

To solve the problem, as shown in FIG. 19, a clock generation circuit may be configured such that a PLL circuit (referred to as a second stage PLL circuit) for receiving the spread spectrum clock signal is further provided so that the high frequency jitter may be reduced by a low-pass filter characteristic of the second stage PLL circuit. In the figure, a frequency modulation circuit for receiving a reference clock signal REFCK and generating a spread spectrum clock signal CK_SSC is denoted by 301. Moreover, the second stage PLL circuit for receiving the clock signal CK_SSC and outputting a clock signal CKOUT is denoted by 302. It is to be noted that the second stage PLL circuit is a general PLL circuit including a phase comparator, a charge pump circuit, a second order LPF (Low Pass Filter), a VCO (voltage-controlled oscillator), and a frequency division circuit. In the clock generation circuit including the second stage PLL circuit, the bandwidth (cut-off frequency) of the second stage PLL circuit is set to be a low bandwidth to reduce the high frequency jitter. Generally, a PLL circuit having a low bandwidth serves as a jitter filter for jitter having a higher frequency component than the bandwidth of an input clock signal.

Patent Document 1: Japanese Laid-Open Patent Publication No. 2005-184488

Document 1: Serial ATA Workgroup "SATA: High Speed Serialized AT Attachment", Revision 1.0, 29 Aug. 2001

DISCLOSURE OF INVENTION

Problems to be Solved by the Invention

However, even a device including an interface in accordance with the Serial ATA standard may have a problem in connectivity, if a spread spectrum clock signal is used in the case where a connection counterpart is a device incapable of supporting the SSC function due to a reason such as a narrow capture range of a clock recovery circuit. Moreover, in developing an LSI including a clock generation circuit, there are many cases where it is desired to verify two states, i.e., a state with the SSC function and a state without the SSC function.

To solve these problems, for example, a clock generation circuit which does not have the SSC function may be provided only for circuit verification. However, this is not preferable in terms of efficiency and cost.

Alternatively, suppose that a clock generation circuit can be configured such that the SSC function can be easily switched ON/OFF. However, if in the case of spread spectrum, the bandwidth (cut-off frequency) of the second stage PLL circuit is set to be a low bandwidth to reduce the high frequency jitter, accumulated jitter of the VCO within the second stage PLL circuit may increase in the case of non-spread spectrum. This may lead to deterioration of connectivity.

The present invention was conceived in view of the above-described circumstances. An object of the present invention is to provide a clock generation circuit in which the SSC function can be easily switched ON/OFF, and an increase of jitter does not deteriorate the connectivity even if the SSC function is switched ON/OFF.

Means for Solving the Problems

To achieve the object, an embodiment of the present invention is a clock generation circuit for generating a clock signal according to a reference clock signal input to the clock generation circuit, the clock generation circuit including a frequency modulation circuit, wherein according to a selection signal showing which one of a frequency-unmodulated clock signal and a frequency-modulated clock signal is to be output, the frequency modulation circuit generates, based on the reference clock signal, one of the frequency-unmodulated clock signal and the frequency-modulated clock signal.

Moreover, an embodiment of the present invention is the aforementioned clock generation circuit, wherein the frequency modulation circuit includes:

a multiphase clock generation circuit for generating a multiphase clock signal composed of a plurality of clock signals having a predetermined phase difference between one another;

a phase subdivision unit for shifting a phase of the multiphase clock signal generated by the multiphase clock generation circuit and outputting the resultant signal;

a clock selection unit for selecting one clock signal from the multiphase clock signal output from the phase subdivision unit and outputting the resultant signal; and a modulation control unit for selecting one of a first control pattern and a second control pattern according to the selection signal to control the shift of the phase carried out by the phase subdivision unit and the selection of the one clock signal carried out by the clock selection unit, wherein in the first control pattern, the shift of the phase carried out by the phase subdivision unit and the selection of the one clock signal carried out by the clock selection unit are fixed, and in the second control pattern, the shift of the phase carried out by the phase subdivision unit and the selection of the one clock signal carried out by the clock selection unit are varied in a predetermined cycle.

Moreover, an embodiment of the present invention is the aforementioned clock generation circuit further including a PLL circuit for receiving the clock signal output from the frequency modulation circuit and for changing a bandwidth according to the selection signal.

Moreover, an embodiment of the present invention is the aforementioned clock generation circuit, wherein when the selection signal shows that a frequency-modulated clock signal is to be output, the PLL circuit reduces the bandwidth more than in the case where the frequency-unmodulated clock signal is input to the PLL circuit.

Moreover, an embodiment of the invention is the aforementioned clock generation circuit further including:

a register unit capable of being written in and read out externally; and a register reference unit for reading information in the register unit to generate and output the selection signal.

Moreover, an embodiment of the present invention is the aforementioned clock generation circuit, wherein the selection signal is fixed to a predetermined logic level.

Moreover, an embodiment of the present invention is the aforementioned clock generation circuit, wherein the PLL circuit includes: a low-pass filter having a resister and a capacitative element; and a charge pump, and the PLL circuit changes both a resistance value of the resister and a capacitance value of the capacitative element in the low-pass filter and a current amount of the charge pump to change the bandwidth.

Moreover, an embodiment of the present invention is the aforementioned clock generation circuit, wherein the selection signal becomes effective when the PLL circuit acquires lock.

Moreover, an embodiment of the present invention is the aforementioned clock generation circuit further including:

a PLL circuit for receiving the clock signal output from the frequency modulation circuit and for changing a bandwidth according to a bandwidth control signal input to the PLL circuit; and a frequency modulation detection circuit for detecting whether the clock signal output from the frequency modulation circuit is frequency-modulated or frequency-unmodulated and for outputting the bandwidth control signal to the PLL circuit according to a result of the detection.

Moreover, an embodiment of the present invention is the aforementioned clock generation circuit, wherein when the bandwidth control signal shows that frequency modulation is done, the PLL circuit reduces the bandwidth more than in the case where the frequency-unmodulated clock signal is input to the PLL circuit.

Moreover, an embodiment of the present invention is the aforementioned clock generation circuit, wherein the frequency modulation detection circuit is composed solely of digital circuits.

EFFECTS OF THE INVENTION

According to the present invention, the SSC function can be easily switched ON/OFF, and an increase of jitter does not deteriorate the connectivity even if the SSC function is switched ON/OFF.

BRIEF DESCRIPTION OF DRAWINGS

FIG. 11 is a view showing a change in frequency of the frequency modulation circuit 110 when SSC is ON.

Figure 1:
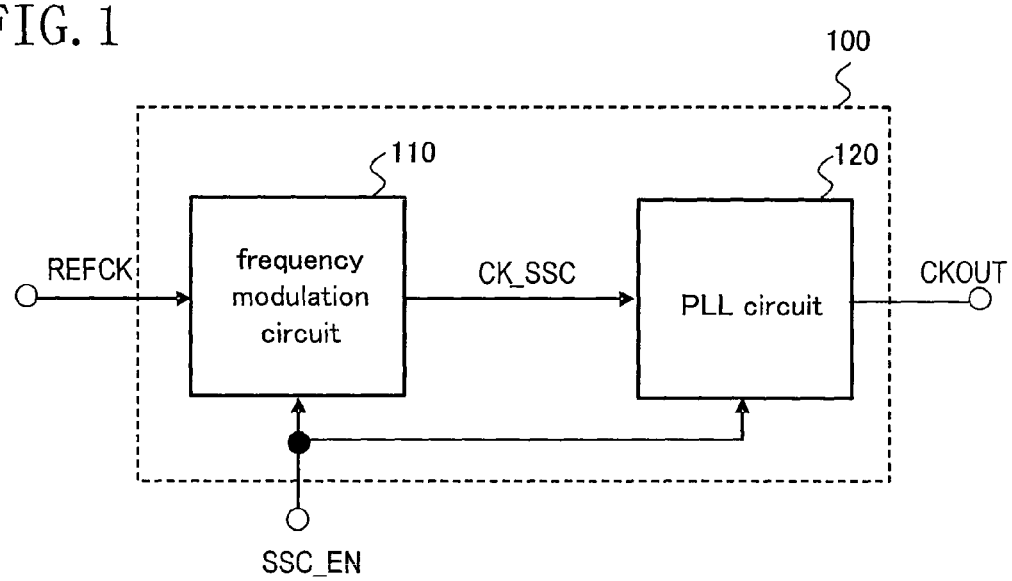
FIG. 1 is a block diagram showing a configuration of a clock generation circuit according to Embodiment 1.

DESCRIPTION OF REFERENCE NUMERALS 100 clock generation circuit
110 frequency modulation circuit
111 multiphase clock generation circuit
112 modulation control unit
113 phase subdivision unit
114 clock selection unit
115 frequency division circuit
120 PLL circuit
120a frequency phase comparison circuit
120b charge pump circuit
120c low-pass filter 120d voltage-controlled oscillation circuit
120e frequency division circuit
200 clock generation circuit
210 frequency modulation circuit
220 frequency modulation detection circuit
221a-221e flip flop
222a-222e flip flop
223a-223c AND circuit
224 OR circuit
225 flip flop

BEST MODE FOR CARRYING OUT THE INVENTION

Referring to the drawings, embodiments of the present invention will be described herein below. In the following description of the individual embodiments and individual variations, the description of components having the same functions as the components that have been described once will be omitted by retaining the same reference numerals.

Embodiment 1 of the Invention

FIG. 1 is a block diagram showing a configuration of a clock generation circuit 100 according to Embodiment 1 of the present invention. As shown in the figure, the clock generation circuit 100 includes a frequency modulation circuit 110 and a PLL circuit 120. The clock generation circuit 100 further includes a terminal for receiving a reference clock signal REFCK, a terminal for outputting an output clock signal CKOUT, and a terminal for receiving a selection signal SSC_EN to switch SSC (spread spectrum clocking) ON/OFF.

(Configuration of Frequency Modulation Circuit 110)

According to the selection signal SSC_EN, the frequency modulation circuit 110 generates, based on the input reference clock REFCK, a frequency-modulated clock signal or a frequency-unmodulated clock signal, which is output as a clock signal CK_SSC to the PLL circuit 120. That is, the frequency modulation circuit 110 is capable of switching ON/OFF a SSC function according to the selection signal SSC_EN. It is to be noted that in the present embodiment, the input reference clock REFCK has 25 MHz. Moreover, when SSC is OFF, the clock signal CK_SSC has 25 MHz, and when SSC is ON, the clock signal CK_SSC has 24.875 MHz to 25 MHz (0 to −0.5% modulation).

Figure 2:
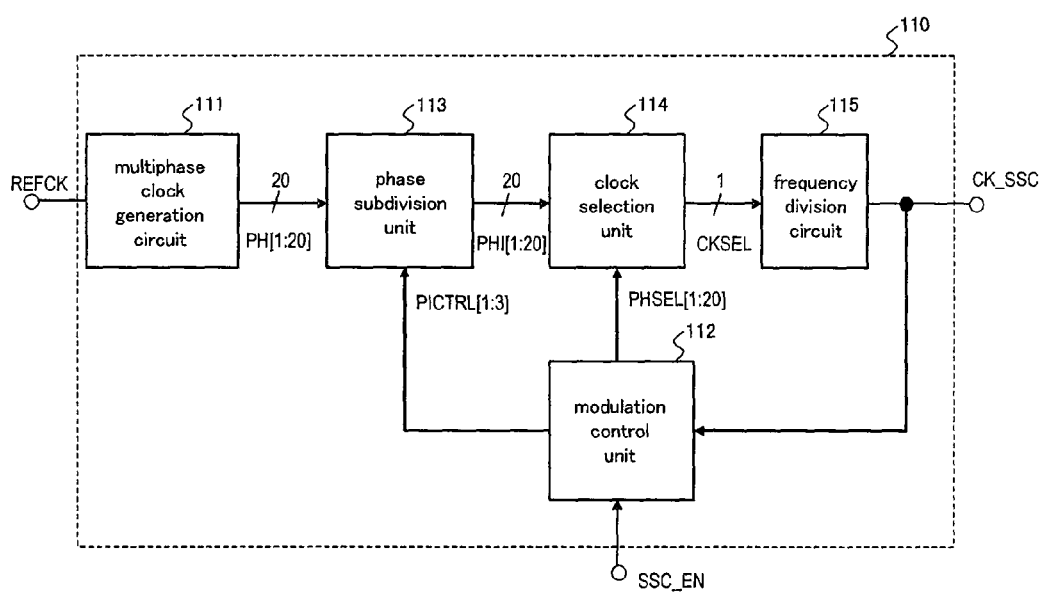
FIG. 2 is a block diagram showing a configuration example of a frequency modulation circuit 110.

Specifically, as shown in FIG. 2, the frequency modulation circuit 110 includes a multiphase clock generation circuit 111, a modulation control unit 112, a phase subdivision unit 113, a clock selection unit 114, and a frequency division circuit 115.

The multiphase clock generation circuit 111 generates, based on the input reference clock REFCK, multiphase clocks PH[1:20] of 250 MHz×20 phases (200 ps steps), which are output to the phase subdivision unit 113.

According to the selection signal SSC_EN, the modulation control unit 112 generates phase control signals PICTRL[1:3] for controlling the phase subdivision unit 113 and clock selection signals PHSEL[1:20] for controlling the clock selection unit 114. The modulation control unit 112 performs this operation in synchronization with the clock signal CK_SSC output from the frequency division circuit 115.

Specifically, the modulation control unit 112 has two control patterns (first and second control patterns) according to ON/OFF of SSC. When SSC is ON (selection signal SSC_EN=H level), the modulation control unit 112 outputs the phase control signals PICTRL[1:3], with their patterns shown in Code 1 to Code 8 of FIG. 3 being repeatedly changed. Moreover, when SSC is ON, the modulation control unit 112 repeatedly outputs the clock selection signals PHSEL[1:20] which respectively correspond to operation modes, i.e., a T mode, a T+ΔT mode, a T+2ΔT mode, a T+3ΔT mode, a T+4ΔT mode, a T+5ΔT mode, a T+6ΔT mode, a T+7ΔT mode, and a T+8ΔT mode which are described later. A repeating pattern is in the order of T mode, T+ΔT mode, T+2ΔT mode, T+3ΔT mode, T+4ΔT mode, T+5ΔT mode, T+6ΔT mode, T+7ΔT mode, T+8ΔT mode, T+7ΔT mode, T+6ΔT mode, T+5ΔT mode, T+4ΔT mode, T+3ΔT mode, T+2ΔT mode, T+ΔT mode, T mode, . . . .

On the other hand, when SSC is OFF (selection signal SSC_EN=L level), the modulation control unit 112 outputs the PICTRL[1:3] with their levels being all fixed to a L level (that is, Code 1), and outputs the clock selection signals PHSEL[1:20] corresponding to the T mode. In the present embodiment, the modulation control unit 112 is designed by, for example, RTL and is a full digital circuit in which all circuits are digital circuits.

According to the phase control signals PICTRL[1:3] output from the modulation control unit 112, the phase subdivision unit 113 shifts the phases of the multiphase clocks PH[1:20] to generate clock signals PHI[1:20] of 20 phases, which are output to the clock selection unit 114. Specifically, according to Codes 1-8 shown in a code table of FIG. 3, the phase subdivision unit 113 shifts the phases by 25 ps as shown in a graph of the figure. Since the PICTRL[1:3] signals are three-bit signals, the phase subdivision unit 113 can perform eight-step control. That is, the resolution is as follows: 200 ps/8=25 ps. It is to be noted that when SSC is OFF, the modulation control portion 112 controls such that the following holds true: PICTRL[1:3]=L, so that the phases are fixed.

Figure 4:
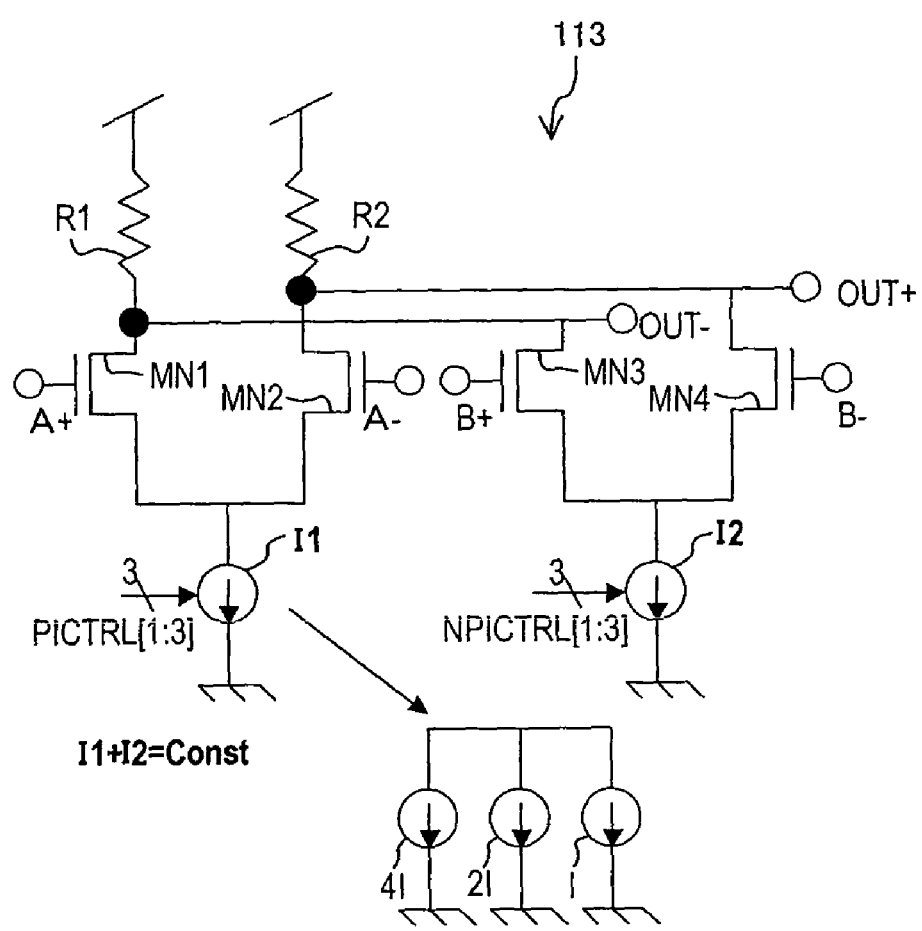
FIG. 4 is a block diagram showing a configuration example of a phase subdivision unit 113.

The phase subdivision unit 113 can be configured by, for example, a circuit shown in FIG. 4. The circuit is a typical current differential type phase interpolator including resisters R1 and R2, two differential switches (a pair of NMOS transistors MN1 and MN2 and a pair of NMOS transistors MN3 and MN4), and current sources I1 and I2. The circuit weights phases by changing the ratio of the current amount of the current source I1 to the current source I2 and outputs the phases between differential inputs A and B to differential outputs OUT.

On this occasion, the current sources I1 and I2 are controlled by the PICTRL[1:3] and NPICTRL[1:3] such that the sum of currents of the current sources I1 and I2 is always constant (note that the NPICTRL[1:3] are inversion signals of the PICTRL[1:3]).

According to the clock selection signals PHSEL[1:20] output from the modulation control portion 112, the clock selection unit 114 selects one of the clock signals PHI[1:20] of 20 phases, which is output as a clock signal CKSEL to the frequency division circuit 115.

Figure 5:
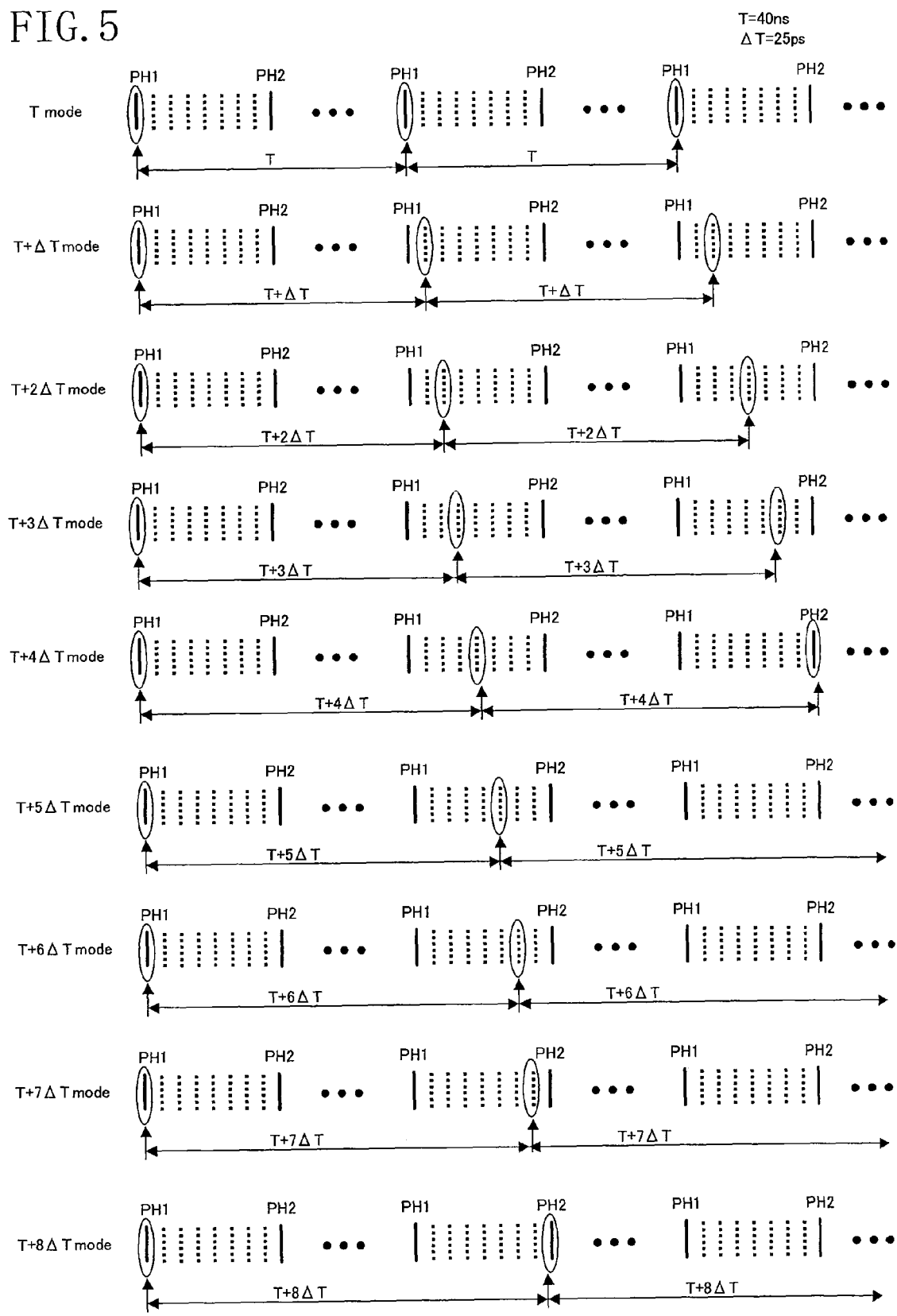
FIG. 5 is a view showing clock signals selected in respective operation modes.

According to each of the following operation modes (the T mode, the T+Δ mode, . . . ), the clock selection unit 114 selects a clock signal as follows (see FIG. 5).

(T mode): the clock selection unit 114 always selects PH1.

(T+ΔT mode): the clock selection unit 114 repeats selecting PH1, PH2, PH3, . . . sequentially by 10 times each.

(T+2ΔT mode): the clock selection unit 114 repeats selecting PH1, PH3, PH5, . . . sequentially by 10 times each.

(T+3ΔT mode): the clock selection unit 114 repeats selecting PH1, PH4, PH7, . . . sequentially by 10 times each.

(T+4ΔT mode): the clock selection unit 114 repeats selecting PH1, PH5, PH9, . . . sequentially by 10 times each.

(T+5ΔT mode): the clock selection unit 114 repeats selecting PH1, PH6, PH11, . . . sequentially by 10 times each.

(T+6ΔT mode): the clock selection unit 114 repeats selecting PH1, PH7, PH13, . . . sequentially by 10 times each.

(T+7ΔT mode): the clock selection unit 114 repeats selecting PH1, PH8, PH15, . . . sequentially by 10 times each.

(T+8ΔT mode): the clock selection unit 114 repeats selecting PH1, PH9, PH17, . . . sequentially by 10 times each.

It is to be noted that when SSC is OFF, the modulation control unit 112 controls such that only the clock selection signal PHSEL[1] is at a H level and is always fixed to the T mode.

Figure 6:
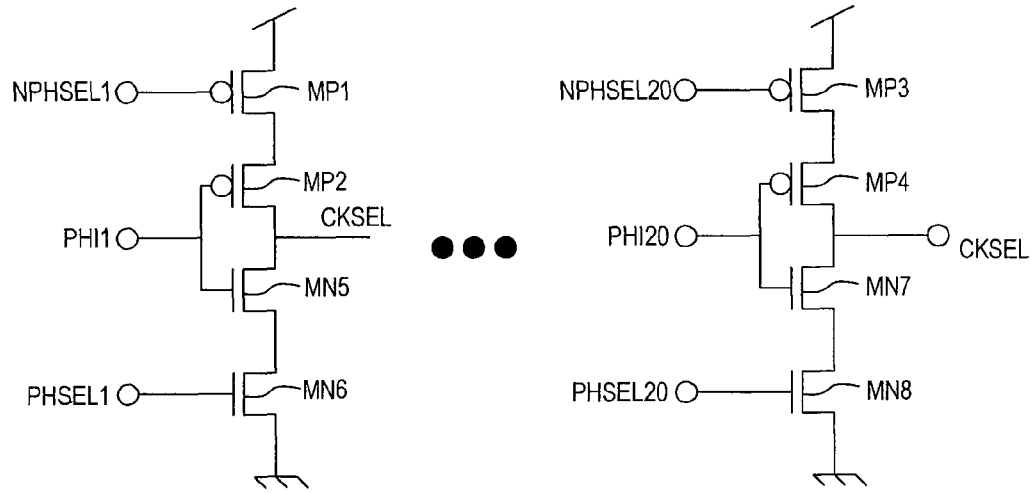
FIG. 6 is a block diagram showing a configuration example of a clock selection unit 114.

The clock selection unit 114 can be configured by, for example, circuits shown in FIG. 6. These circuits are typical 20:1 MUX circuits.

The frequency division circuit 115 divides the frequency of the clock signal CKSEL by 10 and outputs the resultant signal as the clock signal CK_SSC to the PLL circuit 120 and to the modulation control unit 112. Specifically, the frequency division circuit 115 is a 10-divider which is composed of D flip flops.

(Configuration of PLL Circuit 120)

Figure 7:
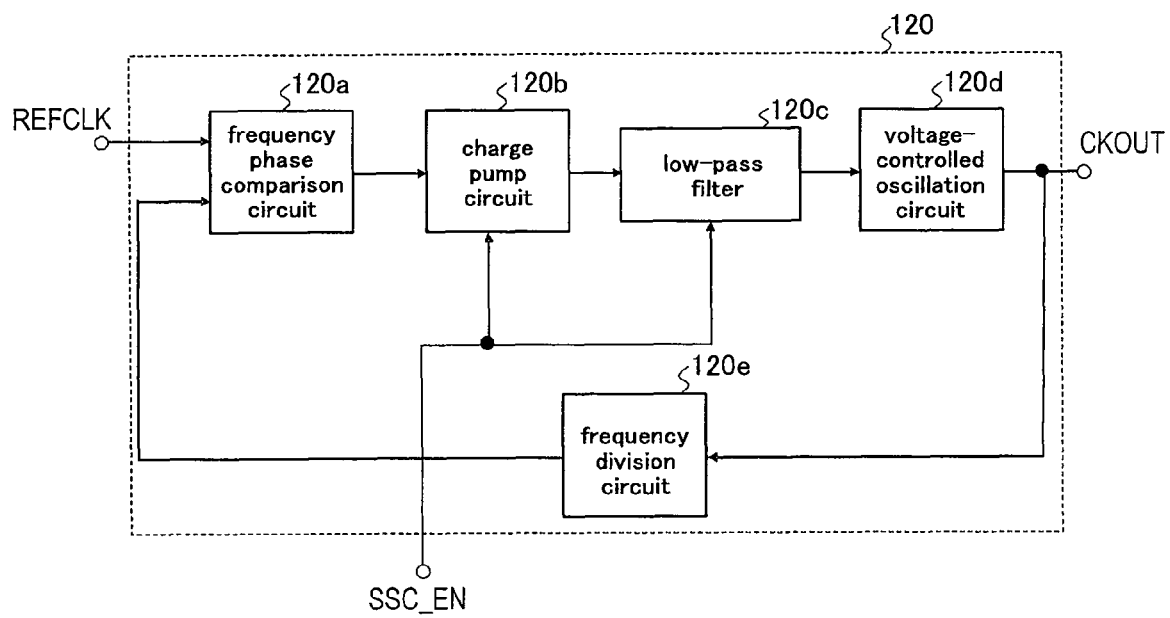
FIG. 7 is block diagram showing a configuration example of a PLL circuit 120.

The PLL circuit 120 is a third order charge pump type PLL circuit and capable of changing the bandwidth according to the level of the selection signal SSC_EN. Specifically, as shown in FIG. 7, the PLL circuit 120 includes a frequency phase comparison circuit 120a (PFD), a charge pump circuit 120b (CP), a low-pass filter 120c (LPF), a voltage-controlled oscillation circuit 120d (VCO), and a frequency division circuit 120e (DIVIDER). Changing the bandwidth is realized by changing the resistance value and the capacitance value respectively of a resistance element and a capacitive element included in the low-pass filter 120c and the current value of the charge pump circuit 120b.

The frequency phase comparison circuit 120a outputs a signal according to the phase difference between the output clock signal CKOUT and the reference clock signal REFCK to the charge pump circuit 120b.

The charge pump circuit 120b outputs a signal having a voltage according to the signal output from the frequency phase comparison circuit 120a. The current value of an output of the charge pump circuit 120b can be changed according to the selection signal SSC_EN.

Figures 8, 9:
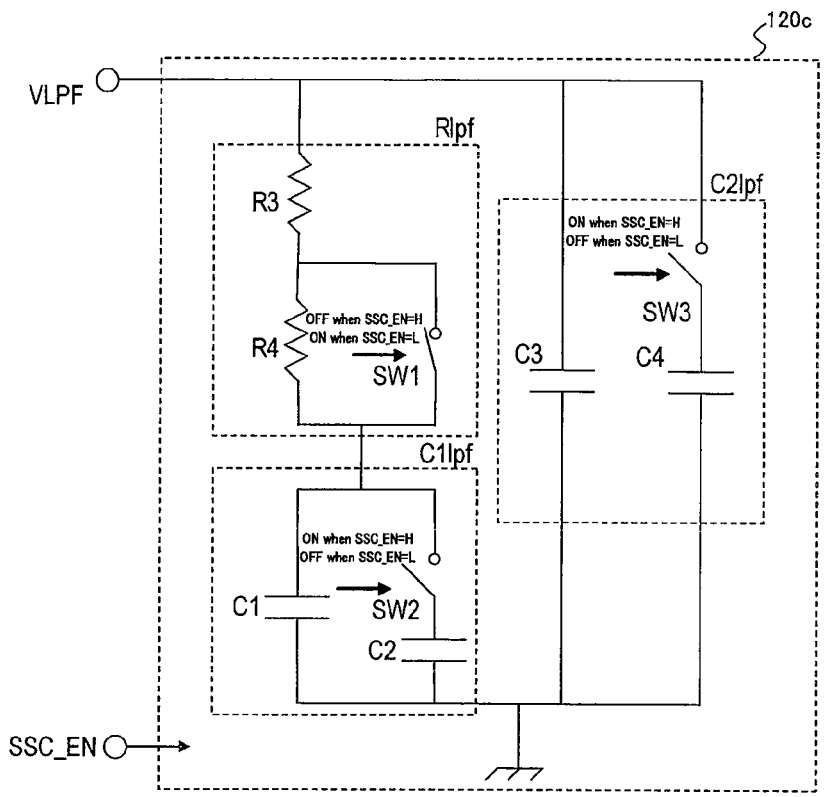
FIG. 8 is a block diagram showing a configuration example of a low-pass filter 120c.
FIG. 9 is a table showing values of respective parameters varying according to SSC_EN.

For example, as shown in FIG. 8, the low-pass filter 120c includes R3, R4, C1, C2, C3, C4, SW1, SW2, and SW3. Depending on whether SSC_EN is H or L, the low-pass filter 120c changes the resistance value and the capacitance value by SW1, SW2, and SW3, thereby changing the bandwidth.

FIG. 9 shows a combination of the set value of the bandwidth corresponding to a level (H level or L level) of the selection signal SSC_EN in the PLL circuit 120 configured as described above and the resistance value, the capacitance values, the charge pump current value (CP current value), and the VCO gain (gain of the voltage-controlled oscillation circuit 120d) at the level.

Here, R3=5 kΩ, R4=2 kΩ, C1=8 pF, C2=19 pF, C3=1 pF, and C4=7 pF. In this case, when SSC_EN=H, the bandwidth BW=4.38 MHz, and when SSC_EN=L, the bandwidth BW=11.4 MHz. When SSC_EN=H, the CP current value is 10 μA, and when SSC_EN=L, the CP current value is 40 μA. It is assumed that the gain of the voltage-controlled oscillation circuit 120d (VCO) is designed to be 2.5 GHz/V in both the case where SSC_EN=H and the case where SSC_EN=L.

The voltage-controlled oscillation circuit 120d outputs the output clock signal CKOUT outside the clock generation circuit 100 and to the frequency division circuit 120e, the output clock signal CKOUT having a frequency according to the voltage output from the low-pass filter 120c.

The frequency division circuit 120e divides the frequency of the output clock signal CKOUT output from the voltage-controlled oscillation circuit 120d and outputs the resultant signal to the frequency phase comparison circuit 120a. In this embodiment, the frequency division circuit 120e divides the frequency of the output clock signal CKOUT by 60.

(Summary of Operation)

Entire operation in the clock generation circuit 100 is such that the frequency modulation circuit 110 receives the input reference clock REFCK (25 MHz) and performs frequency modulation, thereby producing the spread spectrum clock signal CK_SSC, which is output to the PLL circuit 120. The PLL circuit 120 outputs the output clock signal CKOUT, which is the clock signal CK_SSC multiplied by 60. On this occasion, if the selection signal SSC_EN is at a H level, the frequency modulation circuit 110 outputs a frequency-modulated clock signal as the CKOUT, and if the selection signal SSC_EN is at a L level, the frequency modulation circuit 110 outputs a frequency-unmodulated clock signal as the CKOUT.

(Operation when SSC is On)

When SSC is ON (selection signal SSC_EN=L level), the multiphase clock generation circuit 111 receives the input reference clock REFCK of 25 MHz and generates the multiphase clocks PH[1:20] of 250 MHz×20 phases (200 ps steps).

Figure 3:
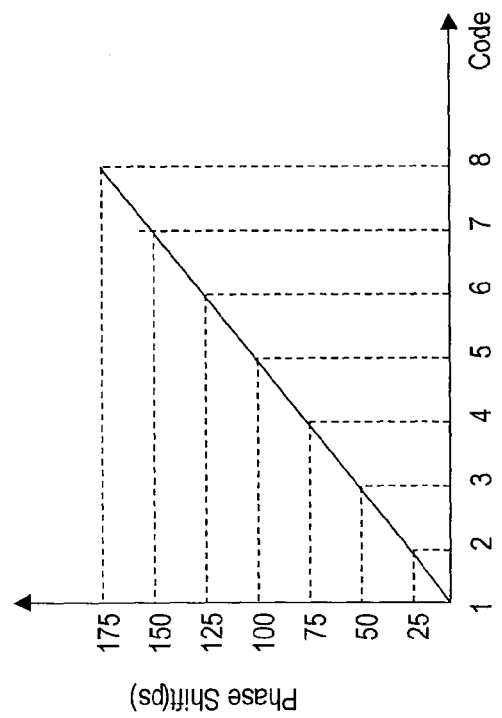
FIG. 3 is a view showing the relationship between the phase control signal output from a modulation control unit 112 and the phase shift amount.

Moreover, the modulation control unit 112 outputs the phase control signals PICTRL[1:3] with repeatedly changing their patterns shown in Codes 1 through 8 of FIG. 3. Moreover, the modulation control unit 112 repeatedly outputs the clock selection signals PHSEL[1:20] corresponding the respective operation modes.

According to the phase control signals PICTRL[1:3] output from the modulation control unit 112, the phase subdivision unit 113 subdivides the multiphase clocks PH[1:20] of 250 Hz×20 phases (200 ps steps) to have 160 phases (25 ps steps). Then, the phase subdivision unit 113 generates the clock signals PHI[1:20] of 20 phases, which are output to the clock selection unit 114.

According to the clock selection signals PHSEL[1:20], the clock selection unit 114 selects one of the clock signals of 20 phases output from the phase subdivision unit 113 and outputs the selected clock signal to the frequency division circuit 115.

Figure 10:
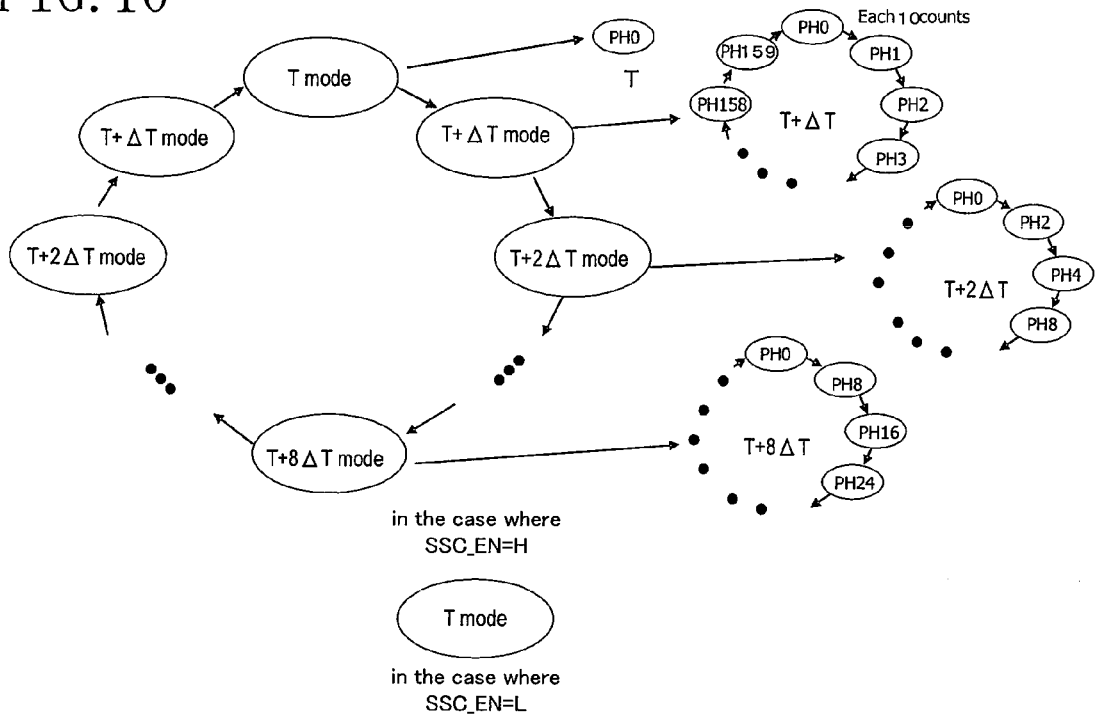
FIG. 10 is a state transition diagram of the frequency modulation circuit 110.

As described above, the operation modes of the phase subdivision unit 113 and the clock selection unit 114 make a transition as shown in FIG. 10. That is, the clock generation circuit 100 endlessly repeats changing its state in the order of T mode, T+ΔT mode, T+2ΔT mode, T+3ΔT mode, T+4ΔT mode, T+5ΔT mode, T+6ΔT mode, T+7ΔT mode, T+8ΔT mode, T+7ΔT mode, T+6ΔT mode, T+5ΔT mode, T+4ΔT mode, T+3ΔT mode, T+2ΔT mode, T+ΔT mode, T mode, . . . . It is to be noted that T is the period of the output clock signal, which is 40 ns, and ΔT is the amount of change in the period, which is 25 ps and corresponds to 0.00625% of 40 ns. Moreover, 200 ps correspond to −0.5% of 40 ns.

The frequency division circuit 115 divides the frequency of an output from the clock selection unit 114 and outputs the clock signal CK_SSC (modulation clock). In this way, performing the frequency division in the frequency division circuit 115 allows a low percent modulation of −0.5% to be realized, even if one phase shift is 200 ps, which is a comparatively large value.

Figure 11:
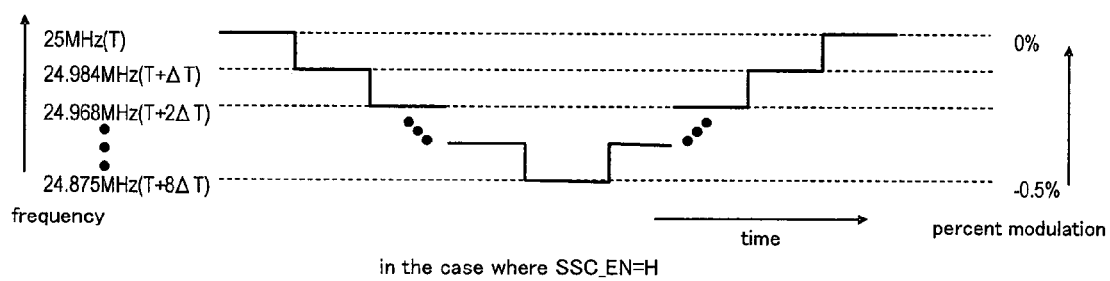

As described above, in the clock generation circuit 100, when SSC is ON, the frequency of the clock signal CK_SSC output from the frequency modulation circuit 110 is changed as shown in FIG. 11 in steps of 0.00625% each from 25 MHz (percentage modulation: 0%) to 24.984 MHz (percentage modulation: −0.00625%), 24.968 MHz (percentage modulation: −0.0125%), . . . , 24.875 MHz (percentage modulation: −0.5%), . . . , 24.968 MHz (percentage modulation: −0.0125%), 24.984 MHz (percentage modulation: −0.00625%), 25 MHz (percentage modulation: 0%), . . . . In this way, the output clock signal CKOUT is modulated in the range of 1.4925 GHz to 1.5 GHz (0 to −0.5% modulation), and the peak value of the spectrum is reduced.

(Operation when SSC is Off)

When SSC is OFF (selection signal SSC_EN=L level), the modulation control unit 112 outputs the PICTRL[1:3] with their levels being all fixed to a L level (that is, Code 1) and outputs the clock selection signals PHSEL[1:20] corresponding to the T mode.

Figure 12:
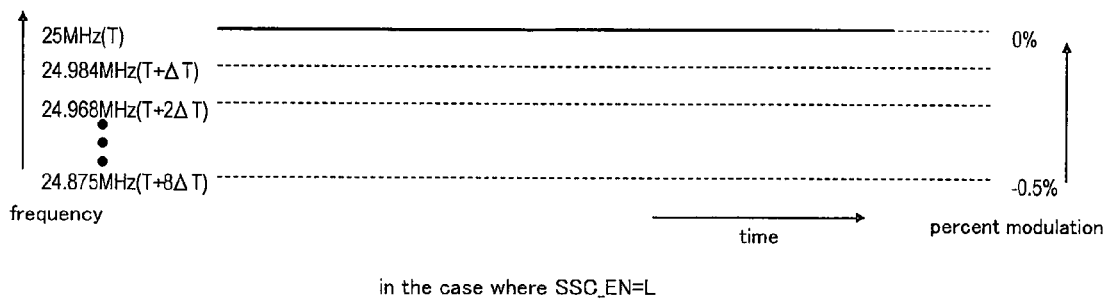
FIG. 12 is a view showing a change in frequency of the frequency modulation circuit 110 when SSC is OFF.

In this way, the phase subdivision unit 113 and the clock selection unit 114 always operate in the T mode. As shown in FIG. 12, the clock signal CK_SSC output from the frequency modulation circuit 110 becomes constant and always has 25 MHz (percentage modulation: 0%). That is, the output clock signal CKOUT output from the PLL circuit 120 is constant and has 1.5 GHz.

As described above, in the present embodiment, it is possible to select whether the output clock signal is frequency-modulated or frequency-unmodulated. Therefore, for example, an LSI designer or a set designer can freely select ON/OFF of the SSC function by changing the selection signal for switching SSC ON/OFF. Therefore, for example, if an LSI or a set of, for example, a DVD player has the clock generation circuit 100 in its transmitter but a connection counterpart (receiver) of the transmitter does not support SSC, and thus the connectivity is not good when SSC is ON, the LSI or the set can be used with SSC being switched OFF. Moreover, since the LSI or the set in the case where the frequency modulation is done and in the case where the frequency modulation is not done can be verified only by circuits in the LSI, no external circuit is necessary for verification and the verification can be performed effectively at low cost.

Moreover, according to the present embodiment, the characteristic of the PLL circuit 120 can be adjusted for the case where the frequency modulation is done and for the case where the frequency modulation is not done. Therefore, it is possible to reduce accumulated jitter of the voltage-controlled oscillation circuit 120d in the PLL circuit 120. That is, in the present embodiment, the improvement of the connectivity when SSC is ON and the reduction of accumulated jitter when SSC is OFF can become mutually compatible.

If only the current of the charge pump is changed to vary the bandwidth of the PLL circuit 120, not only the bandwidth but also the phase margin of the PLL vary. However, in the present embodiment, both the current amount of the charge pump circuit 120b and the cut-off frequency (specifically, the resistance value and the capacitance value) of the low-pass filter 120c are changed. Therefore, it is also possible to keep the phase margin constant.

Variation of Embodiment 1 of the Invention

Figure 13:
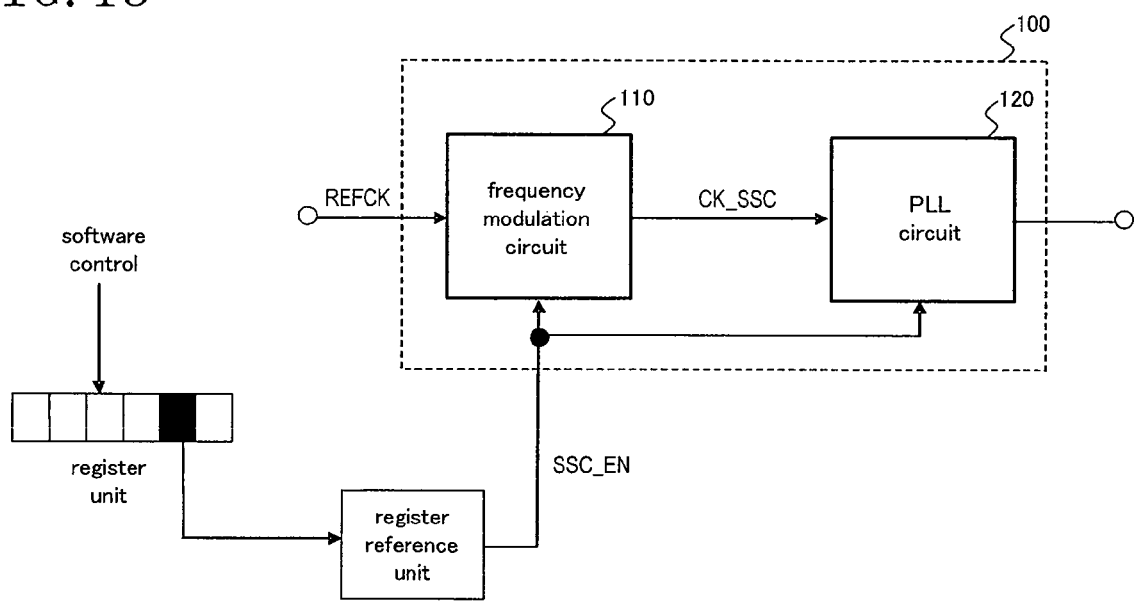
FIG. 13 is a block diagram showing a configuration of a clock generation circuit according to a variation of Embodiment 1.

As shown in FIG. 13, a register unit and a register reference unit may be added to the clock generation circuit 100. Information can be written in and read from the register unit externally. The register reference unit reads out the information in the register unit to generate and output the selection signal SSC_EN. According to this configuration, for example, rewriting contents of the register unit by software allows SSC to be switched ON/OFF.

Alternatively, the register unit may hold a predetermined value so that the selection signal SSC_EN is fixed to a predetermined logic level. In this way, the same circuit can be provided as a clock generation circuit dedicated to SSC or as a clock generation circuit without the SSC function.

Another Variation of Embodiment 1 of the Invention

Figure 14:
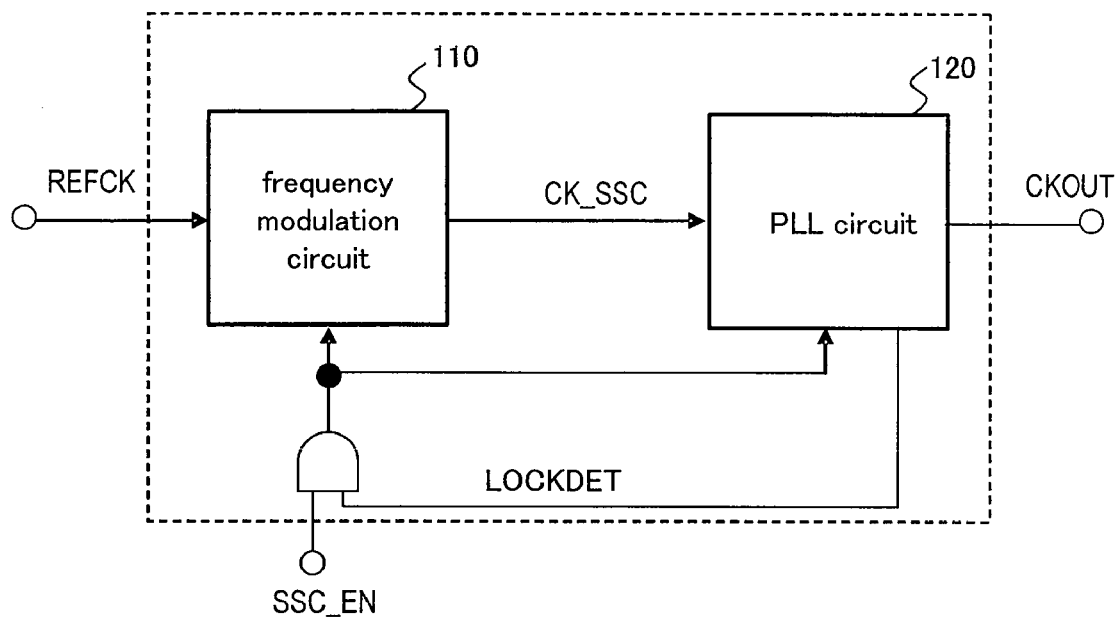
FIG. 14 is a block diagram showing a configuration of a clock generation circuit according to another variation of Embodiment 1.

After it is confirmed that the PLL circuit 120 has acquired lock, SSC may be switched ON. Specifically, as shown in FIG. 14, the PLL circuit 120 outputs a lock detection signal showing whether the PLL has acquired lock or not (LOCKDET: for c example, H shows that the PLL has acquired lock, and L shows that the PLL has not acquired lock). An AND circuit is provided which receives the lock detection signal and the selection signal SSC_EN which is externally input. An output from the AND circuit serves as a signal for controlling switching ON/OFF of SSC and is input to the frequency modulation circuit 110.

This configuration can ensure stable lock operation of the PLL circuit and stable system startup. Moreover, it is no longer necessary to simulate a lock process in the case where the frequency modulation is done, which leads to a reduction in design period.

In the above mentioned embodiment and variations, the descriptions have been given with reference to the examples in which the PICTRL[1:3] signals are three-bit signals and the eight-step frequency modulation is realized. However, as the number of divisions (quantum number) of a frequency increases, a change in the frequency over time approximates a triangular waveform, and the effect of reducing the peak value of the spectrum increases.

When the phase subdivision unit 113 is in differential operation and the clock selection unit 114 is in single operation, a differential-single conversion circuit may be provided between the phase subdivision unit 113 and the clock selection unit 114 (When both of the phase subdivision unit 113 and the clock selection unit 114 are in differential operation or are in single operation, the conversion circuit is not necessary.).

Embodiment 2 of the Invention

Figure 15:
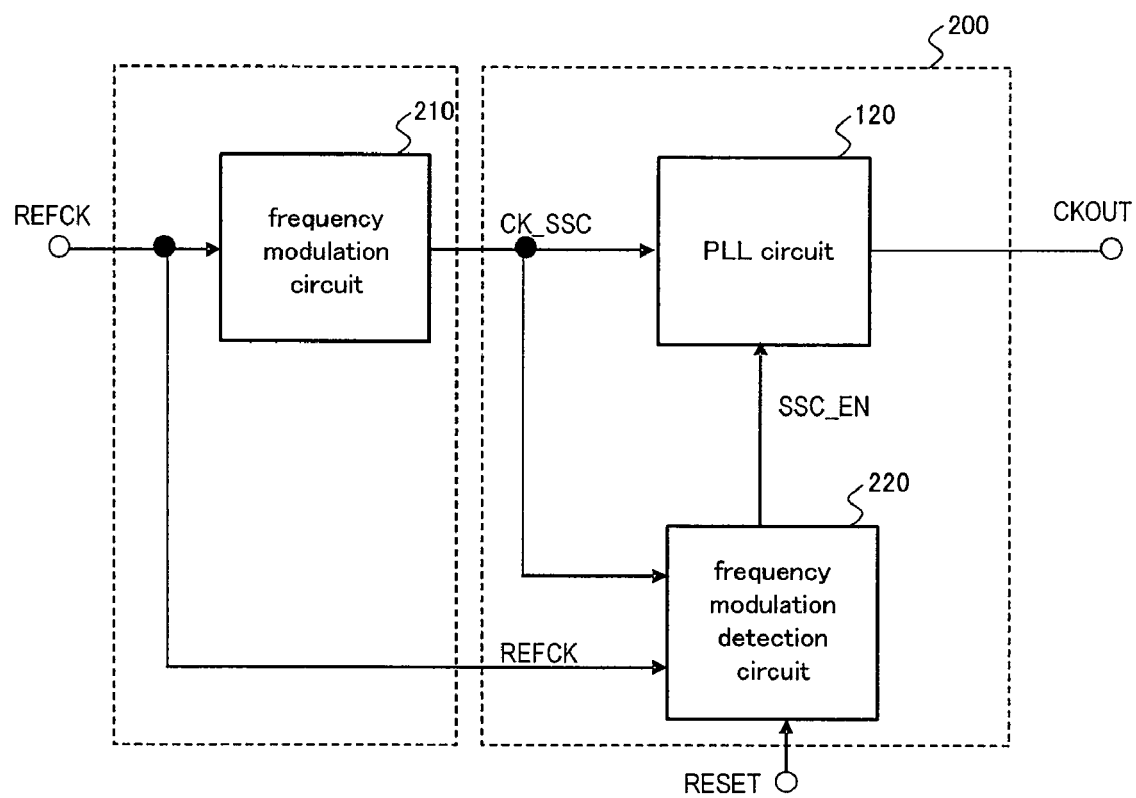
FIG. 15 is a block diagram showing a configuration of a clock generation circuit according to Embodiment 2.

FIG. 15 is a block diagram showing a configuration of a clock generation circuit 200 according to Embodiment 2 of the present invention. As shown in FIG. 15, the clock generation circuit 200 includes a PLL circuit 120, a frequency modulation circuit 210, and a frequency modulation detection circuit 220. Moreover, the clock generation circuit 200 includes a terminal for receiving a reference clock signal REFCK, a terminal for outputting an output clock signal CKOUT, and a terminal for receiving a reset signal RESET.

The frequency modulation circuit 210 generates, based on the input reference clock REFCK, a clock signal, which is output as a clock signal CK_SSC. In the present embodiment, the frequency modulation circuit 210 is provided on a chip different from a chip having the PLL circuit 120 and the frequency modulation detection circuit 220, and the frequency modulation circuit 210 is a frequency modulation circuit on the digital system. Moreover, there are the cases where the clock signal generated by the frequency modulation circuit 210 is frequency-modulated or frequency-unmodulated.

The frequency modulation detection circuit 220 detects whether the clock signal CK_SSC generated by the frequency modulation circuit 210 is frequency-modulated or frequency-unmodulated. When the clock signal CK_SSC is frequency-modulated, the frequency modulation detection circuit 220 outputs a selection signal SSC_EN at a H level, and when the clock signal CK_SSC is frequency-unmodulated, the frequency modulation detection circuit 220 outputs a selection signal SSC_EN at a L level.

Figure 16:
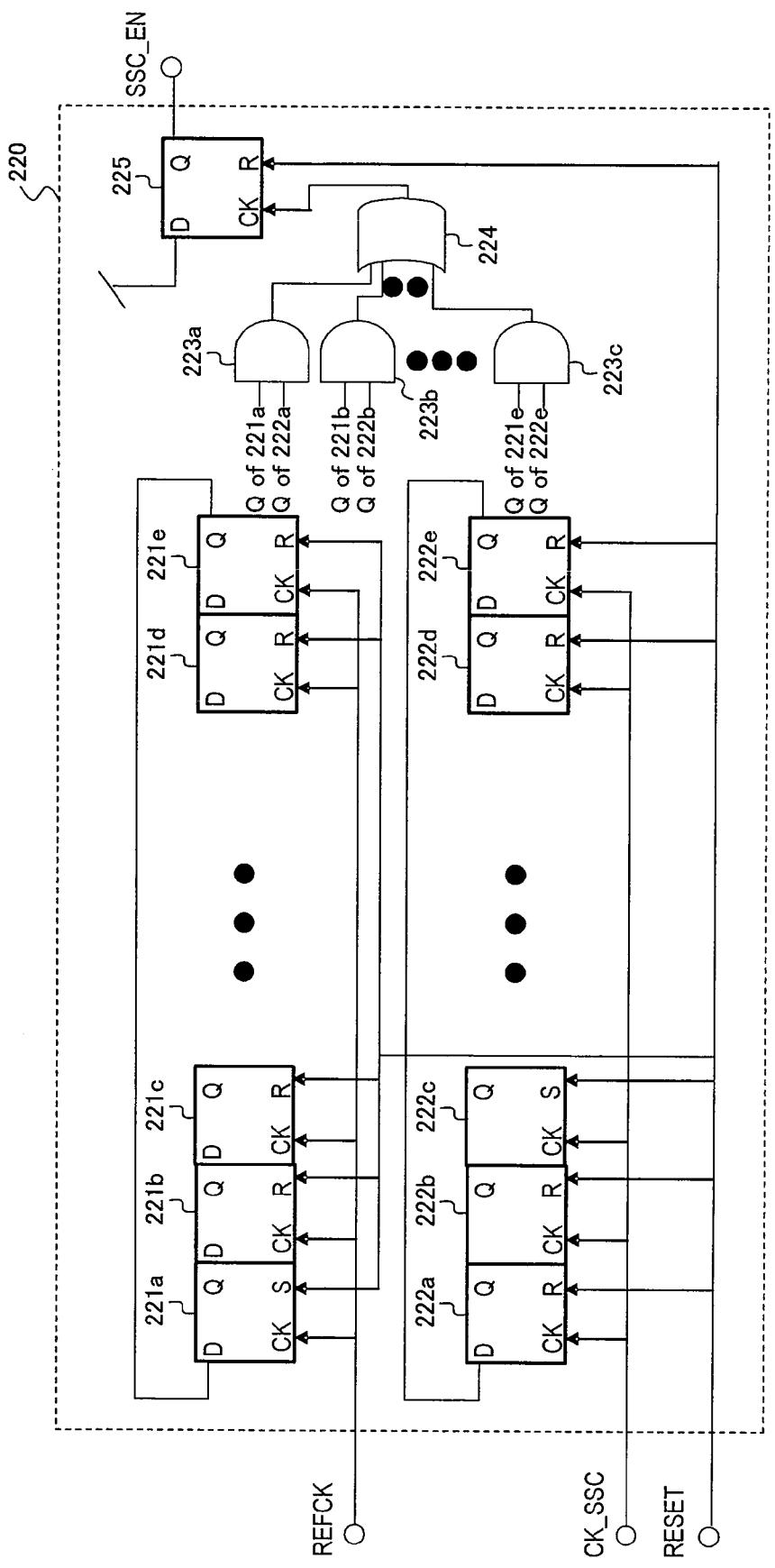
FIG. 16 is a block diagram showing a configuration example of a frequency modulation detection circuit 220.
Figure 17:
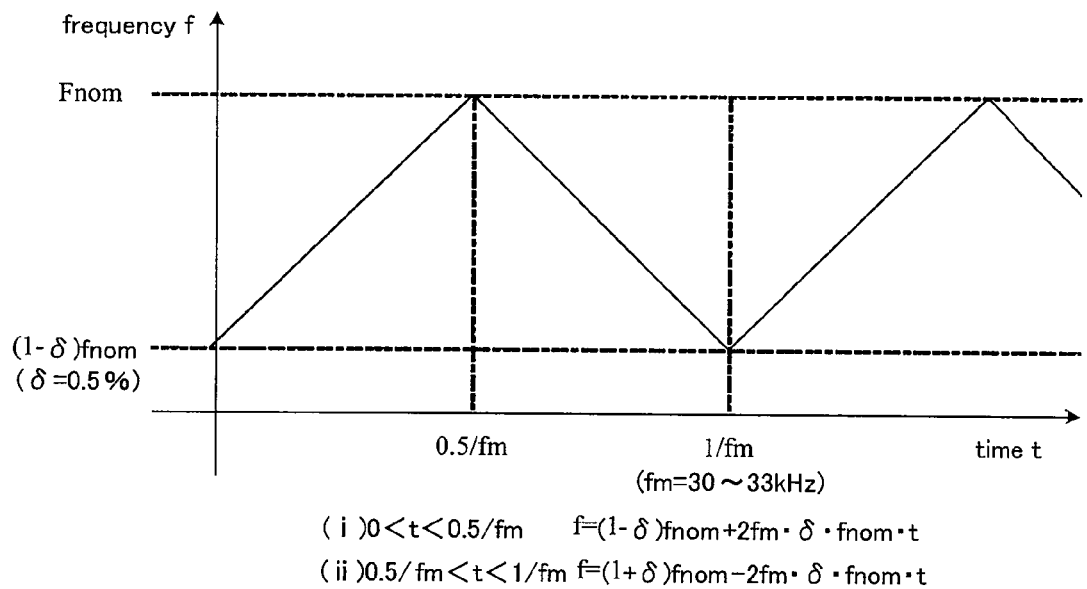
FIG. 17 is a view showing a change in frequency of a clock signal when SSC is ON in a Serial ATA standard.
Figure 18:
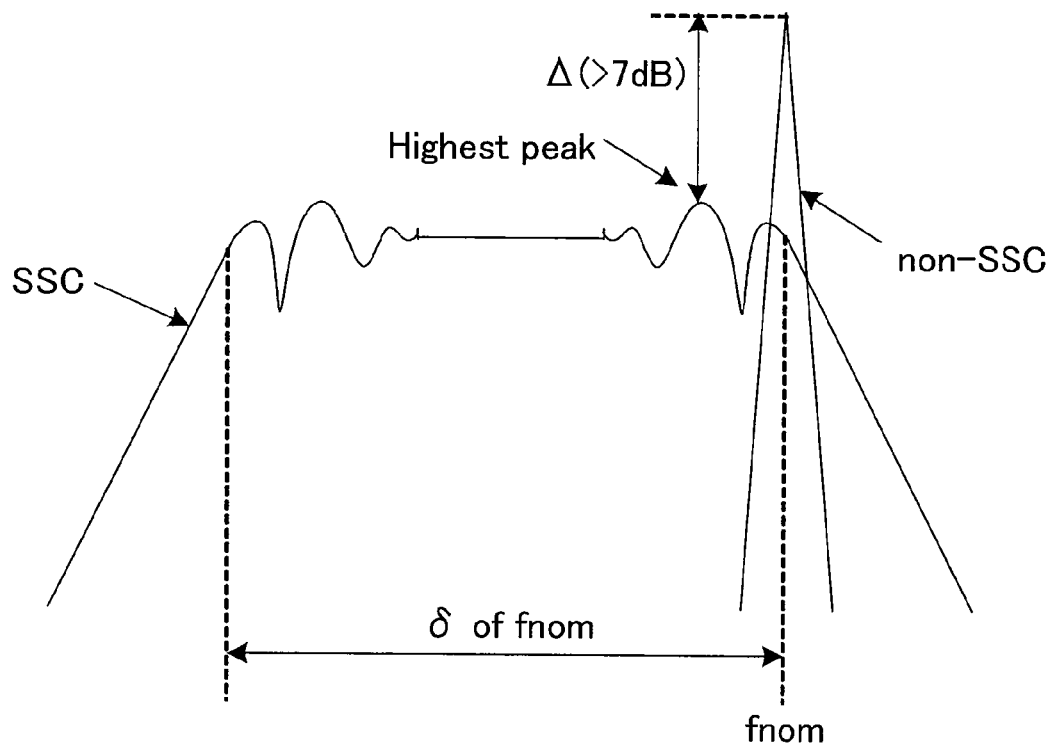
FIG. 18 is a view showing an example of a spectrum of a clock signal when SSC is OFF in the Serial ATA standard.
Figure 19:
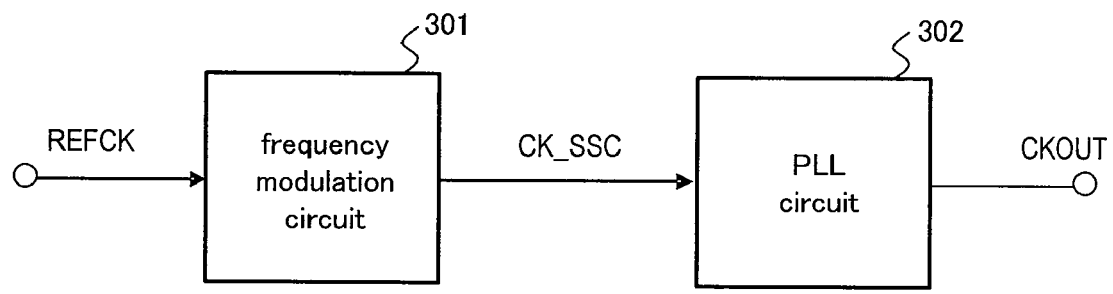
FIG. 19 is a view showing an example of a conventional clock generation circuit for reducing high frequency jitter.

FIG. 16 is a block diagram showing a configuration example of the frequency modulation detection circuit 220. As shown in FIG. 16, the frequency modulation detection circuit 220 includes flip flops 221a to 221e, flip flops 222a to 222e, AND circuits 223a to 223c, an OR circuit 224, and a flip flop 225. Moreover, the frequency modulation detection circuit 220 receives the clock signal CK_SSC, the reference clock signal REFCK, and the reset signal RESET.

Among the flip flops, the flip flop 221a and the flip flop 222c have a set function, and the other flip flops have a reset function.

The flip flops 221a to 221e constitute a shift register (REFCK shift register) in which the reference clock signal REFCK serves as CK inputs to the flip flops (D flip flops). Moreover, the flip flops 222a to 222e constitute a shift register (CK_SSC shift register) in which the clock signal CK_SSC serves as CK inputs to the flip flops (D flip flop).

(Summary of Operation)

Entire operation of the clock generation circuit 200 is such that the clock signal CK_SSC output from the frequency modulation circuit 210 is input to the PLL circuit 120 and the frequency modulation detection circuit 220. The PLL circuit 120 increases the frequency of the clock signal CK_SSC and outputs the resultant signal as the CKOUT. On this occasion, the frequency modulation detection circuit 220 detects whether the clock signal CK_SSC is modulated or unmodulated, and the PLL circuit 120 receives a result of the detection. When the clock signal CK_SSC is modulated, the bandwidth of the PLL circuit 120 is reduced, and when the clock signal CK_SSC is unmodulated, the bandwidth of the PLL circuit 120 is increased.

(Operation of Frequency Modulation Detection Circuit 220)

In the clock generation circuit 200, in an initial state, the reset signal RESET is at a H level. In this case, as an initial value, only a Q output of the first flip flop 221a from the left in the REFCK shift register is at a H level, and as an initial value, a Q output of the third flip flop 222c from the left in the CK_SSC shift register is at a H level. On this occasion, the other flip flops are in a reset state, and their Q outputs are fixed at a L level.

After the reset signal RESET is changed to a L level to release the reset, operation of the shift registers begins. When the clock signal CK_SSC is unmodulated, H level periods of Q outputs of the flip flops constituting the REFCK shift register and Q outputs of the flip flops constituting the CK_SSC shift register never overlap with each other. Therefore, the AND of the Q outputs of the flip flops constituting the REFCK shift register and the Q outputs of the flip flops constituting the CK_SSC shift register never becomes H level. That is, the selection signal SSC_EN remains at a L level.

On the other hand, when the clock signal CK_SSC is modulated, there are variations in frequency, and thus the H level periods of the Q outputs of the flip flops constituting the REFCK shift register and the Q outputs of the flip flops constituting the CK_SSC shift register overlap with each other at a given time. That is, the selection signal SSC_EN changes to a H level.

When the selection signal SSC_EN is input to the PLL circuit 120, the bandwidth of the PLL circuit 120 is adjusted according to the selection signal SSC_EN. Therefore, characteristics of the PLL circuit 120 can be adjusted according to whether the clock signal CK_SSC output from the frequency modulation circuit 210 is frequency-modulated or frequency-unmodulated. This allows jitter to be reduced. Moreover, the frequency modulation detection circuit 220 has a simple configuration configured on the full-digital system in which signal processing is performed at a logic level, and thus can be realized to operate with low power and to have a small area, and process migration can also be facilitated.

In the above mentioned embodiments and variations, the descriptions have been given of a device for generating a clock signal according to the interface standard of Serial ATA. However, the application of the present invention is not limited to this. The present embodiment can be applied to any clock generation circuit which requires spread spectrum clocking for EMI prevention.

INDUSTRIAL APPLICABILITY

The clock generation circuit of the present invention allows the SSC function to be easily switched ON/OFF, has the effect that the connectivity does not deteriorate by an increase of jitter even if the SSC function is switched ON/OFF, and is applicable to a clock generation circuit or the like which has a spread spectrum clocking function.

The invention claimed is:

1. A clock generation circuit for generating a clock signal according to a reference clock signal input to the clock generation circuit,
    the clock generation circuit comprising a frequency modulation circuit, wherein according to a selection signal showing which one of a frequency-unmodulated clock signal and a frequency-modulated clock signal is to be output, the frequency modulation circuit generates, based on the reference clock signal, one of the frequency-unmodulated clock signal and the frequency-modulated clock signal, and
    a PLL circuit for receiving the clock signal output from the frequency modulation circuit and for changing a bandwidth according to the selection signal,
    wherein the PLL circuit includes a low-pass filter having a resister and a capacitative element, and a charge pump, and
    the PLL circuit changes both a resistance value of the resister and a capacitance value of the capacitative element in the low-pass filter and a current amount of the charge pump to change the bandwidth.

2. The clock generation circuit of claim 1, wherein the frequency modulation circuit includes:
    a multiphase clock generation circuit for generating a multiphase clock signal composed of a plurality of clock signals having a predetermined phase difference between one another;
    a phase subdivision unit for shifting a phase of the multiphase clock signal generated by the multiphase clock generation circuit and outputting the resultant signal;
    a clock selection unit for selecting one clock signal from the multiphase clock signal output from the phase subdivision unit and outputting the resultant signal; and
    a modulation control unit for selecting one of a first control pattern and a second control pattern according to the selection signal to control the shift of the phase carried out by the phase subdivision unit and the selection of the one clock signal carried out by the clock selection unit, wherein in the first control pattern, the shift of the phase carried out by the phase subdivision unit and the selection of the one clock signal carried out by the clock selection unit are fixed, and in the second control pattern, the shift of the phase carried out by the phase subdivision unit and the selection of the one clock signal carried out by the clock selection unit are varied in a predetermined cycle.

3. The clock generation circuit of claim 1, wherein when the selection signal shows that a frequency-modulated clock signal is to be output, the PLL circuit reduces the bandwidth more than in the case where the frequency-unmodulated clock signal is input to the PLL circuit.

4. The clock generation circuit of claim 1, further comprising:
- a register unit capable of being written in and read out externally; and
- a register reference unit for reading information in the register unit to generate and output the selection signal.

5. The clock generation circuit of claim 1, wherein the selection signal is fixed to a predetermined logic level.

6. The clock generation circuit of claim 1, wherein the selection signal becomes effective when the PLL circuit acquires lock.

7. The clock generation circuit of claim 1, further comprising:
- a frequency modulation detection circuit for detecting whether the clock signal output from the frequency modulation circuit is frequency-modulated or frequency-unmodulated and for outputting the bandwidth control signal to the PLL circuit according to a result of the detection.

8. The clock generation circuit of claim 7, wherein when the bandwidth control signal shows that frequency modulation is done, the PLL circuit reduces the bandwidth more than in the case where the frequency-unmodulated clock signal is input to the PLL circuit.

9. The clock generation circuit of claim 7, wherein the frequency modulation detection circuit is composed solely of digital circuits.

* * * * *

UNITED STATES PATENT AND TRADEMARK OFFICE
CERTIFICATE OF CORRECTION

PATENT NO. : 7,825,707 B2  Page 1 of 1
APPLICATION NO. : 12/095094
DATED : November 2, 2010
INVENTOR(S) : Tsuyoshi Ebuchi It is certified that error appears in the above-identified patent and that said Letters Patent is hereby corrected as shown below:

ON THE TITLE PAGE:

In Item "(56) References Cited", below the data listed under "US PATENT DOCUMENTS" please delete "2005/1013550 6/2005 Ebuchi et al".

Signed and Sealed this
Twenty-ninth Day of March, 2011

David J. Kappos
*Director of the United States Patent and Trademark Office*